United States Patent
Tago et al.

(10) Patent No.: US 10,455,706 B2
(45) Date of Patent: Oct. 22, 2019

(54) RESIN SUBSTRATE, COMPONENT MOUNTED RESIN SUBSTRATE, AND METHOD OF MANUFACTURING COMPONENT MOUNTED RESIN SUBSTRATE

(71) Applicant: Murata Manufacturing Co., Ltd., Nagaokakyo-shi, Kyoto-fu (JP)

(72) Inventors: Shigeru Tago, Nagaokakyo (JP); Kuniaki Yosui, Nagaokakyo (JP); Yuki Ito, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/928,175

(22) Filed: Mar. 22, 2018

(65) Prior Publication Data

US 2018/0213653 A1  Jul. 26, 2018

Related U.S. Application Data

(63) Continuation of application No. PCT/JP2016/079211, filed on Oct. 3, 2016.

(30) Foreign Application Priority Data

Oct. 15, 2015  (JP) .................................. 2015-203392

(51) Int. Cl.
*H05K 5/00* (2006.01)
*H05K 3/32* (2006.01)
(Continued)

(52) U.S. Cl.
CPC ............. *H05K 3/32* (2013.01); *H05K 1/0271* (2013.01); *H05K 1/116* (2013.01); *H05K 3/0011* (2013.01);
(Continued)

(58) Field of Classification Search
CPC ........ H05K 1/181; H05K 1/182; H05K 1/186; H05K 1/0281; H05K 2201/02
(Continued)

(56) References Cited

U.S. PATENT DOCUMENTS

| 8,829,648 B2* | 9/2014 | Iguchi ..................... H01L 28/40 257/532 |
| 2004/0178486 A1 | 9/2004 | Maeda |

(Continued)

FOREIGN PATENT DOCUMENTS

| JP | 05-243731 A | 9/1993 |
| JP | 2004-273777 A | 9/2004 |

(Continued)

OTHER PUBLICATIONS

Official Communication issued in International Patent Application No. PCT/JP2016/079211, dated Dec. 13, 2016.

*Primary Examiner* — Binh B Tran
(74) *Attorney, Agent, or Firm* — Keating & Bennett, LLP

(57) ABSTRACT

A resin substrate includes a thermoplastic resin base body, a mounting land conductor on a surface of the resin base body to be connected to a component, first and second reinforcement conductor patterns, and first interlayer connection conductors. The first and second reinforcement conductor patterns are each embedded in the resin base body and have a planar shape that includes a position overlapping the mounting land conductor when viewing the resin base body in plan view. The first interlayer connection conductors connect the first and second reinforcement conductor patterns in a thickness direction of the resin base body. The first interlayer connection conductors are arranged at positions different from the mounting land conductor when viewing the resin base body in plan view.

14 Claims, 8 Drawing Sheets

(51) Int. Cl.
*H05K 3/46* (2006.01)
*H05K 1/11* (2006.01)
*H05K 3/00* (2006.01)
*H05K 1/02* (2006.01)
H05K 7/00 (2006.01)
H05K 1/18 (2006.01)
H05K 3/40 (2006.01)
H05K 3/34 (2006.01)

(52) U.S. Cl.
CPC ............. *H05K 3/46* (2013.01); *H05K 3/4632* (2013.01); *H05K 1/111* (2013.01); *H05K 1/181* (2013.01); *H05K 3/3436* (2013.01); *H05K 3/4069* (2013.01); *H05K 2201/0129* (2013.01); *H05K 2201/0141* (2013.01); *H05K 2201/10734* (2013.01); *H05K 2203/0285* (2013.01)

(58) Field of Classification Search
USPC .................................. 361/748, 760, 761, 767
See application file for complete search history.

(56) References Cited

U.S. PATENT DOCUMENTS

| | | |
|---|---|---|
| 2004/0212087 A1 | 10/2004 | Murayama et al. |
| 2007/0057363 A1 | 3/2007 | Nakamura et al. |
| 2008/0036094 A1 | 2/2008 | Yoneda |
| 2012/0002380 A1 | 1/2012 | Kato |
| 2014/0321069 A1 | 10/2014 | Gouchi et al. |
| 2015/0366080 A1 | 12/2015 | Saitoh et al. |
| 2016/0057863 A1* | 2/2016 | Kyozuka ............... H01L 21/486 361/764 |

FOREIGN PATENT DOCUMENTS

| | | |
|---|---|---|
| JP | 2004-327721 A | 11/2004 |
| JP | 2006-245382 A | 9/2006 |
| JP | 3855947 B2 | 12/2006 |
| JP | 2007-073766 A | 3/2007 |
| JP | 2014-168039 A | 9/2014 |
| WO | 2010/106839 A1 | 9/2010 |
| WO | 2013/187117 A1 | 12/2013 |

* cited by examiner

RESIN SUBSTRATE, COMPONENT MOUNTED RESIN SUBSTRATE, AND METHOD OF MANUFACTURING COMPONENT MOUNTED RESIN SUBSTRATE

CROSS REFERENCE TO RELATED APPLICATIONS

This application claims the benefit of priority to Japanese Patent Application No. 2015-203392 filed on Oct. 15, 2015 and is a Continuation Application of PCT Application No. PCT/JP2016/079211 filed on Oct. 3, 2016. The entire contents of each application are hereby incorporated herein by reference.

BACKGROUND OF THE INVENTION

1. Field of the Invention

The present invention relates to a resin substrate made of a flexible material and including a surface to which a component is to be mounted, a component mounted resin substrate in which the component is mounted to the resin substrate, and a method of manufacturing the component mounted resin substrate.

2. Description of the Related Art

Until now, component mounted resin substrates have very often been used in a variety of electronic devices. The component mounted resin substrate includes a resin substrate and an electronic component. The electronic component is mounted to the resin substrate.

Japanese Patent No. 3855947, for example, discloses a structure in which a semiconductor bare chip is mounted to a surface of a flexible substrate having thermoplastic properties. The semiconductor bare chip is joined to the flexible substrate by ultrasonic joining.

There is a difficulty in applying a joining method of heating an entire substrate, such as a solder reflow, to the flexible substrate having thermoplastic properties. The joining method of heating an entire substrate causes a risk that the flexible substrate is softened or melted and is deformed.

Even when ultrasonic joining is utilized, instead of heating of an entire substrate, a portion of the flexible substrate tends to soften and deform due to frictional heat generated by the ultrasonic joining. Furthermore, because ultrasonic vibration is absorbed due to flexibility of the flexible substrate, it is difficult to achieve the ultrasonic joining with sufficient joining strength. Thus, a joining defect is more likely to occur.

SUMMARY OF THE INVENTION

Preferred embodiments of the present invention provide resin substrates to which electronic components are to be joined with higher reliability, component mounted resin substrates each including the resin substrate and the electronic component or components, and methods of manufacturing the component mounted resin substrates.

A resin substrate according to a preferred embodiment of the present invention includes a thermoplastic resin base body, a mounting land conductor provided on a surface of the resin base body to be connected to a component, a first reinforcement conductor pattern, a second reinforcement conductor pattern, and a plurality of first interlayer connection conductors. The first reinforcement conductor pattern is embedded in the resin base body, and has a planar shape overlapping the entire or substantially the entire mounting land conductor when viewing the resin base body in plan view. The second reinforcement conductor pattern is embedded in the resin base body, and has a planar shape of which at least a portion overlaps the first reinforcement conductor pattern, and which includes a position overlapping the mounting land conductor, when viewing the resin base body in plan view. The plurality of first interlayer connection conductors connect the first reinforcement conductor pattern and the second reinforcement conductor pattern in a thickness direction of the resin base body. The plurality of first interlayer connection conductors are provided at positions different from the mounting land conductor when viewing the resin base body in plan view.

With the features described above, two reinforcement conductor patterns are provided under the mounting land conductor to which the component is joined by ultrasonic joining. Furthermore, those two reinforcement conductor patterns are connected by the interlayer connection conductors. Accordingly, the strength of the resin base body immediately under the mounting land conductor is increased in directions parallel or substantially parallel and perpendicular or substantially perpendicular to a mounting surface of the resin base body, and deformation of the resin base body is reduced or prevented. In addition, since no interlayer connection conductors are provided immediately under the mounting land conductor, a reduction in flatness of the mounting land conductor caused by interlayer connection conductors provided immediately under the mounting land conductor is reduced, and thus, an adverse influence on the joining caused by the reduction in flatness is reduced.

In a resin substrate according to a preferred embodiment of the present invention, preferably, the first reinforcement conductor pattern, the second reinforcement conductor pattern, and the plurality of first interlayer connection conductors are not connected to other conductor patterns provided in contact with the resin base body.

With the feature described above, the first reinforcement conductor pattern, the second reinforcement conductor pattern, and the plurality of first interlayer connection conductors are able to be arranged with the sole intent to ensure reinforcement at the time of mounting the component, and there is no need to consider connection to other conductor patterns for a circuit. In addition, the shapes of those members are easily simplified because only the reinforcement needs to be considered without electrical characteristics being considered.

A resin substrate according to a preferred embodiment of the present invention is preferably structured as follows. The resin substrate includes a third reinforcement conductor pattern and a plurality of second interlayer connection conductors. The third reinforcement conductor pattern is embedded in the resin base body, and has a planar shape of which at least a portion overlaps the first reinforcement conductor pattern and the second reinforcement conductor pattern, and which includes a position overlapping the mounting land conductor, when viewing the resin base body in plan view. The plurality of second interlayer connection conductors connect the second reinforcement conductor pattern and the third reinforcement conductor pattern in the thickness direction of the resin base body. The plurality of first interlayer connection conductors and the plurality of second interlayer connection conductors are provided at different positions when viewing the resin base body in plan view.

With the features described above, the strength of the resin base body immediately under the mounting land conductor is further increased. Moreover, since the first interlayer connection conductors and the second interlayer connection conductors are not overlapped with each other, a reduction in flatness of the resin substrate caused by the first interlayer connection conductors and the second interlayer connection conductors is reduced, and thus, an adverse influence on the joining caused by the reduction in flatness is reduced.

In a resin substrate according to a preferred embodiment of the present invention, preferably, the first reinforcement conductor pattern, the second reinforcement conductor pattern, the plurality of first interlayer connection conductors, the third reinforcement conductor pattern, and the plurality of second interlayer connection conductors are not connected to other conductor patterns provided in contact with the resin base body.

With the feature described above, the conductor patterns and interlayer connection conductors are able to be arranged with the sole intent to ensure reinforcement at the time of mounting the component, and there is no need to consider connection to other conductor patterns for a circuit. In addition, the shapes of those members are easily simplified because only the reinforcement needs to be considered without electrical characteristics being considered.

A resin substrate according to a preferred embodiment of the present invention is preferably structured as follows. The mounting land conductor includes a plurality of mounting land conductors. The first reinforcement conductor pattern overlaps the plurality of mounting land conductors when viewing the resin base body in plan view.

With the features described above, the plurality of mounting land conductors are reinforced by the shared first reinforcement conductor pattern. Accordingly, the strength is increased as compared to the case in which the first reinforcement conductor pattern is provided for each mounting land conductor.

In a resin substrate according to a preferred embodiment of the present invention, the first reinforcement conductor pattern may include, at a position different from positions of the plurality of mounting land conductors, a conductor non-formed portion in which the first reinforcement conductor pattern is not provided, when viewing the resin base body in plan view.

With the feature described above, a wiring conductor is able to be provided in the conductor non-formed portion even in the resin base body including the first reinforcement conductor pattern. As a result, the wiring conductor is able to be easily provided in the resin base body.

In a resin substrate according to a preferred embodiment of the present invention, preferably, a distance between the first reinforcement conductor pattern and the surface of the resin base body is smaller than half a thickness of the resin base body.

With the feature described above, since a distance between the mounting land conductor and the first reinforcement conductor pattern is short, and the strength of the resin substrate is increased effectively.

In a resin substrate according to a preferred embodiment of the present invention, preferably, the resin base body includes a plurality of thermoplastic resin layers that are stacked, and the first reinforcement conductor pattern is provided between a first resin layer at the surface of the resin base body at which the mounting land conductor is provided and a second resin layer contacting the resin layer.

With the features described above, since the distance between the mounting land conductor and the first reinforcement conductor pattern is even shorter, and the strength of the resin substrate is increased more effectively.

A component mounted resin substrate according to a preferred embodiment of the present invention includes a resin substrate, and a component joined to the resin substrate with a plurality of bumps interposed therebetween. The resin substrate includes a thermoplastic resin base body, a mounting land conductor, a first reinforcement conductor pattern, a second reinforcement conductor pattern, and a plurality of first interlayer connection conductors. The mounting land conductor is provided on a surface of the resin base body and is connected to the component. The first reinforcement conductor pattern is embedded in the resin base body, and has a planar shape including a position overlapping the mounting land conductor when viewing the resin base body in plan view. A second reinforcement conductor pattern is embedded in the resin base body, and has a planar shape of which at least a portion overlaps the first reinforcement conductor pattern, and which includes a position overlapping the mounting land conductor, when viewing the resin base body in plan view. The plurality of first interlayer connection conductors connect the first reinforcement conductor pattern and the second reinforcement conductor pattern in a thickness direction of the resin base body. The component is mounted to the resin base body with the plurality of bumps joined to the mounting land conductor by ultrasonic joining. The plurality of first interlayer connection conductors are provided at positions different from the plurality of bumps when viewing the resin base body in plan view. The plurality of bumps entirely overlap the first reinforcement conductor pattern when viewing the resin base body in plan view.

With the features described above, two reinforcement conductor patterns are provided under the mounting land conductor that is joined to the bumps of the component by ultrasonic joining. Furthermore, those two reinforcement conductor patterns are connected by the interlayer connection conductors. Accordingly, strength of the resin base body immediately under the mounting land conductor is increased in directions parallel or substantially parallel and perpendicular or substantially perpendicular to a mounting surface of the mounting land conductor, and deformation of the resin base body is reduced or prevented. In addition, since no interlayer connection conductors are provided immediately under the mounting land conductor, a reduction in flatness of the mounting land conductor caused by interlayer connection conductors provided immediately under the mounting land conductor is reduced, and thus, an adverse influence on the joining caused by the reduction in flatness is reduced.

A component mounted resin substrate according to a preferred embodiment of the present invention is preferably structured as follows. The plurality of bumps are arranged at positions satisfying the following condition with respect to the plurality of first interlayer connection conductors. When viewing the resin base body in plan view, a circular region is set for each of the plurality of first interlayer connection conductors, the circular region including a center in a position of one first interlayer connection conductor and a radius defined by a distance between the one first interlayer connection conductor and another first interlayer connection conductor closest to the one first interlayer connection conductor. At least one of the plurality of bumps overlaps a region in which circular regions overlap each other.

With the feature described above, the one or more bumps are mounted in the region in which the strength of the resin base body is effectively increased by the plurality of first interlayer connection conductors. Accordingly, a joining defect is more effectively reduced or prevented.

A method of manufacturing a component mounted resin substrate according to a preferred embodiment of the present invention includes forming a mounting land conductor on a surface of a first resin layer that forms a portion of a resin base body and has thermoplastic properties, forming a first reinforcement conductor pattern on a surface of a second resin layer that forms a portion of the resin base body and has thermoplastic properties, and forming a second reinforcement conductor pattern on a surface of a third resin layer that forms a portion of the resin base body and has thermoplastic properties. The method of manufacturing the component mounted resin substrate further includes steps of forming a plurality of through-holes at positions not overlapping a plurality of bumps of a component in a state of the component being mounted to the resin base body, in a region of the second resin layer in which the first reinforcement conductor pattern is formed, and filling a conductive paste into the plurality of through-holes. The method of manufacturing the component mounted resin substrate further includes steps of successively arranging the first resin layer, the second resin layer, and the third resin layer in order, stacking a plurality of resin layers including the first to third resin layers, and press-joining the stacked resin layers together under heating. The method of manufacturing the component mounted resin substrate further includes a step joining the plurality of bumps of the component to the mounting land conductor by ultrasonic joining. The plurality of bumps entirely overlap the first reinforcement conductor pattern when viewing the resin base body in plan view.

A method of manufacturing a component mounted resin substrate according to a preferred embodiment of the present invention includes forming a mounting land conductor on a surface of a first resin layer that forms a portion of a resin base body and has thermoplastic properties, forming a first reinforcement conductor pattern on a surface of a second resin layer that forms a portion of the resin base body and has thermoplastic properties, and forming a second reinforcement conductor pattern on a surface of a third resin layer that forms a portion of the resin base body and has thermoplastic properties. The method of manufacturing the component mounted resin substrate further includes steps of forming a plurality of through-holes at positions not overlapping a plurality of bumps of a component in a state of the component being mounted to the resin base body, in a region of the second resin layer in which the first reinforcement conductor pattern is formed, and filling a conductive paste into the plurality of through-holes. The method of manufacturing the component mounted resin substrate further includes steps of successively arranging the first resin layer, the second resin layer, and the third resin layer in order, stacking a plurality of resin layers including the first to third resin layers, and press-joining the stacked resin layers together under heating. The method of manufacturing the component mounted resin substrate further includes a step of joining the plurality of bumps of the component to the mounting land conductor with an anisotropic conductive film interposed therebetween. The plurality of bumps entirely overlap the first reinforcement conductor pattern when viewing the resin base body in plan view.

With the features described above, such a structure easily provides reinforcement to the resin base body at the time of joining the plurality of bumps to the mounting land conductor on the surface of the resin base body. As a result, the component mounted resin substrate having high reliability in the joining between the mounting land conductor and the plurality of bumps is able to be easily manufactured.

In a method of manufacturing the component mounted resin substrate according to a preferred embodiment of the present invention, preferably, the first reinforcement conductor pattern, the second reinforcement conductor pattern, and the plurality of first interlayer connection conductors are not connected to other conductor patterns formed in contact with the resin base body.

With the manufacturing method described above, the first reinforcement conductor pattern, the second reinforcement conductor pattern, and the plurality of first interlayer connection conductors are able to be arranged with intent only to ensure reinforcement at the time of mounting the component, and there is no need to consider connection to other conductor patterns for a circuit. In addition, the shapes of those members are easily simplified because only the reinforcement needs to be considered without electrical characteristics being considered. Accordingly, a pattern shape of the reinforcement conductor pattern is simplified, and design is facilitated.

According to preferred embodiments of the present invention, it is possible to obtain resin substrates to which electronic components are to be joined with higher reliability, and component mounted resin substrates that ensure high connection reliability between the electronic components and the resin substrates.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
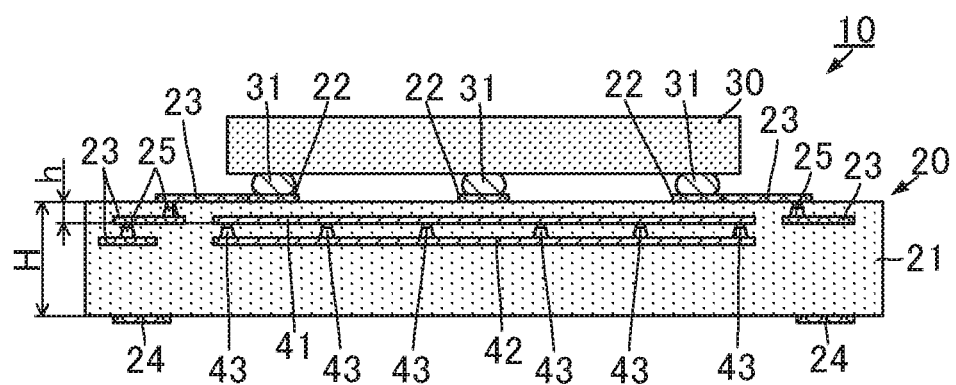
FIG. 1 is a sectional view illustrating a structure of a component mounted resin substrate according to a first preferred embodiment of the present invention.
Figure 2:
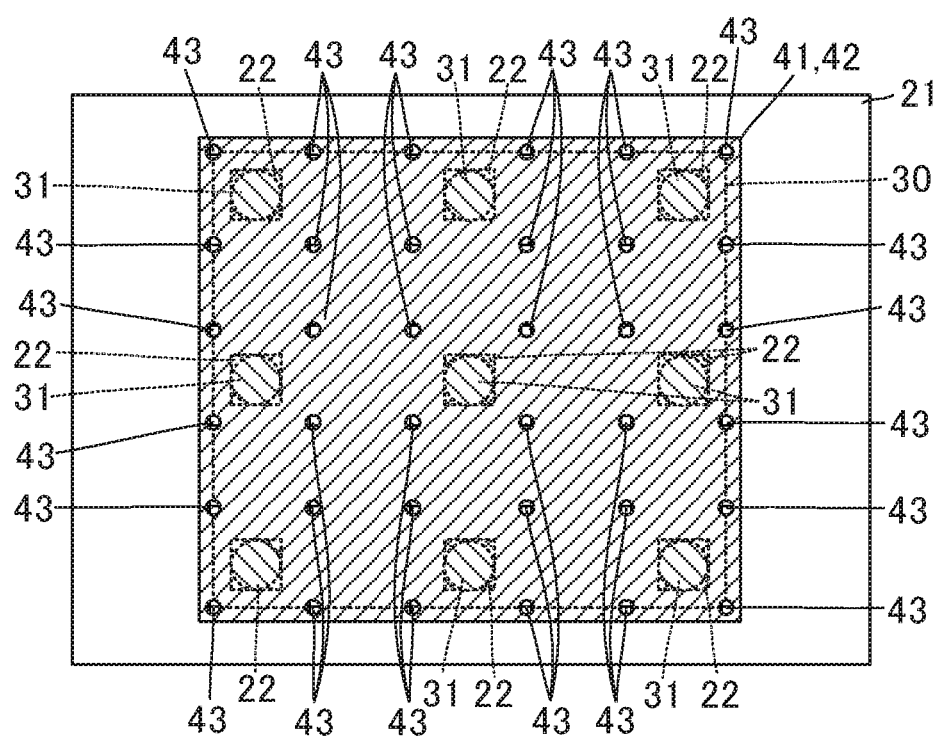
FIG. 2 is a plan view illustrating positional relationships between mounting land conductors and interlayer connection conductors of the component mounted resin substrate according to the first preferred embodiment of the present invention.

A resin substrate 20, a component mounted resin substrate 10, and a method of manufacturing the component mounted resin substrate, according to a first preferred embodiment of the present invention, will be described with reference to the drawings. FIG. 1 is a sectional view illustrating a structure of the component mounted resin substrate according to the first preferred embodiment of the present invention. FIG. 2 is a plan view illustrating positional relationship between mounting land conductors and interlayer connection conductors of the component mounted resin substrate according to the first preferred embodiment of the present invention.

As illustrated in FIG. 1, the component mounted resin substrate 10 includes the resin substrate 20 and an electronic component 30. The electronic component 30 corresponds to a "component" in descriptions of preferred embodiments of the present invention and preferably has a flat or substantially flat plate shape. A plurality of outer connection terminals are provided on a rear surface of the electronic component 30, and bumps 31 are provided on the outer connection terminals. The bumps 31 are provided in an array on the rear surface of the electronic component 30.

The resin substrate 20 includes a resin base body 21, a plurality of mounting land conductors 22, wiring conductor patterns 23, outer connection conductors 24, reinforcement conductor patterns 41 and 42, and interlayer connection conductors 25 and 43.

The resin base body 21 is made of a thermoplastic material. The resin base body 21 preferably includes a liquid crystal polymer, for example, as a main material.

The mounting land conductors 22 are provided on a front surface (mounting surface) of the resin base body 21. The mounting land conductors 22 are each preferably a rectangular or substantially rectangular conductor pattern. The mounting land conductors 22 are provided in an arrangement pattern corresponding to an arrangement pattern of the bumps 31 of the electronic component 30 mounted onto the resin base body 21.

The wiring conductor patterns 23 are provided on the front surface of the resin base body and in the resin base body 21. The wiring conductor pattern 23 provided on the front surface of the resin base body 21 is connected to the corresponding mounting land conductor 22. The wiring conductor pattern 23 provided on the front surface and the wiring conductor pattern 23 provided in the resin base body are connected to each other by the interlayer connection conductors 25, and the wiring conductor patterns 23 provided in the resin base body are also connected to each other by the interlayer connection conductors 25.

The outer connection conductors 24 are provided on the rear surface of the resin base body 21. The outer connection conductors 24 are connected to the predetermined wiring conductor patterns 23 by conductor patterns, interlayer connection conductors, and other conductors, which are not illustrated.

The reinforcement conductor patterns 41 and 42 are each defined by a planar conductor. The reinforcement conductor pattern 41 corresponds to a "first reinforcement conductor pattern", and the reinforcement conductor pattern 42 corresponds to a "second reinforcement conductor pattern". The reinforcement conductor patterns 41 and 42 are each provided inside the resin base body 21. The reinforcement conductor patterns 41 and 42 include surfaces perpendicular or substantially perpendicular to a thickness direction of the resin base body 21. In other words, surfaces of the reinforcement conductor patterns 41 and 42 are parallel or substantially parallel to the front and rear surfaces of the resin base body 21. The reinforcement conductor patterns 41 and 42 are arranged with a certain distance maintained therebetween in the thickness direction of the resin base body 21. The reinforcement conductor pattern 41 is disposed closer to the front surface of the resin base body 21 than the reinforcement conductor pattern 42 is to the front surface of the resin base body 21.

Although the reinforcement conductor patterns 41 and 42 are connected to each other by a plurality of interlayer connection conductors 43, they are not connected to an electrical circuit defined by the component mounted resin substrate 10. Thus, the reinforcement conductor patterns 41 and 42 are dummy conductors that do not function as an electrical circuit.

The interlayer connection conductors 43 connect the reinforcement conductor patterns 41 and 42 in the thickness direction of the resin base body 21. The interlayer connection conductors 43 are not connected to any conductor patterns other than the reinforcement conductor patterns 41 and 42. Thus, the interlayer connection conductors 43 are also dummy conductors that do not function as an electrical circuit. In other words, the reinforcement conductor patterns 41 and 42 and the interlayer connection conductors 43 are not connected to any other conductor patterns provided in contact with the resin base body 21. The interlayer connection conductors 43 connecting the reinforcement conductor patterns 41 and 42 correspond to "first interlayer connection conductors".

As illustrated in FIG. 2, each of the reinforcement conductor patterns 41 and 42 has an area covering all the mounting land conductors 22 to which the bumps 31 of the electronic component 30 are joined. When viewing the resin base body 21 in plan view, the reinforcement conductor patterns 41 and 42 are each arranged at a position overlapping all the mounting land conductors 22.

As illustrated in FIG. 2, the interlayer connection conductors 43 are provided at positions different from positions of the bumps 31 of the electronic component 30. In other words, interlayer connection conductors 43 are arranged at positions not overlapping the bumps 31 of the electronic component 30, when viewing the resin base body 21 in plan view.

With the above-described arrangement, a three-dimensional structure extending in both a direction parallel or substantially parallel to the mounting surface and a direction perpendicular or substantially perpendicular to the mounting surface (i.e., in the thickness direction of the resin base body 21) and having higher strength than resin of the resin base body 21 is able to be provided in regions immediately under the bumps 31 of the electronic component 30.

As a result, deformation of the resin base body 21 is able to be reduced or prevented even with the resin of the resin base body 21 being softened when the bumps 31 are joined to the mounting land conductors 22 by ultrasonic joining. Thus, a joining defect is able to be reduced or prevented from occurring during the ultrasonic joining between the bumps 31 and the mounting land conductors 22. Furthermore, since an ultrasonic wave is effectively applied to each joining region, a good joining state is obtained, and the component mounted resin substrate 10 having high joining reliability is obtained.

Moreover, since the bumps 31 of the electronic component 30 are not overlapped with the interlayer connection conductors 43 when viewed in plan view, an influence of a difference in thickness between the positions at which the interlayer connection conductors 43 are arranged and a region except for those positions is reduced or prevented when the resin substrate 20 is formed. Assuming, for example, the case in which the bumps 31 of the electronic component 30 include some bumps 31 overlapping the interlayer connection conductors 43 and the other bumps 31 not overlapping the interlayer connection conductors 43, a thickness of the resin substrate 20 is different depending on positions corresponding to those two types of bumps 31. However, variations in thickness of the resin substrate 20 at the positions corresponding to the bumps 31 are reduced or prevented by arranging the interlayer connection conductors 43 so as not to be overlapped with the bumps 31. Accordingly, the joining strength between the bumps 31 and the mounting land conductors 22 is ensured, and higher joining strength is achieved.

More preferably, the mounting land conductors 22 and the interlayer connection conductors 43 are not overlapped with each other when viewed in plan view. In this case, the difference in thickness of the resin substrate 20 at the positions corresponding to the bumps 31 is more likely to decrease. Accordingly, the joining strength between the bumps 31 and the mounting land conductors 22 is further ensured, and even higher joining strength is achieved.

Figure 5:
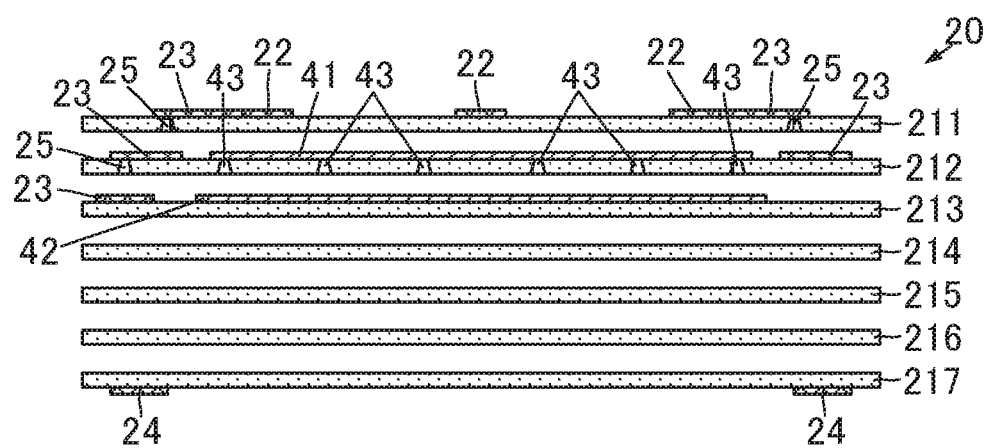
FIG. 5 is a side sectional view illustrating a stacked state of the resin substrate of the component mounted resin substrate according to the first preferred embodiment of the present invention.

In the present preferred embodiment, a distance h between the reinforcement conductor pattern 41 and the front surface of the resin base body 21 (the distance being measured along the thickness direction of the resin base body 21) is preferably smaller than half a thickness H of the resin base body 21. For instance, when the resin base body 21 is formed by stacking a plurality of resin layers as illustrated in FIG. 5 described later, the distance h between the reinforcement conductor pattern 41 and the front surface of the resin base body 21 is a distance corresponding to one resin layer that is interposed therebetween. With the above-described arrangement, a distance between the mounting land conductors 22 and the reinforcement conductor pattern 41 in the thickness direction of the resin base body 21 is shortened, and stability in the joining by using the three-dimensional structure is further increased.

Figure 3:
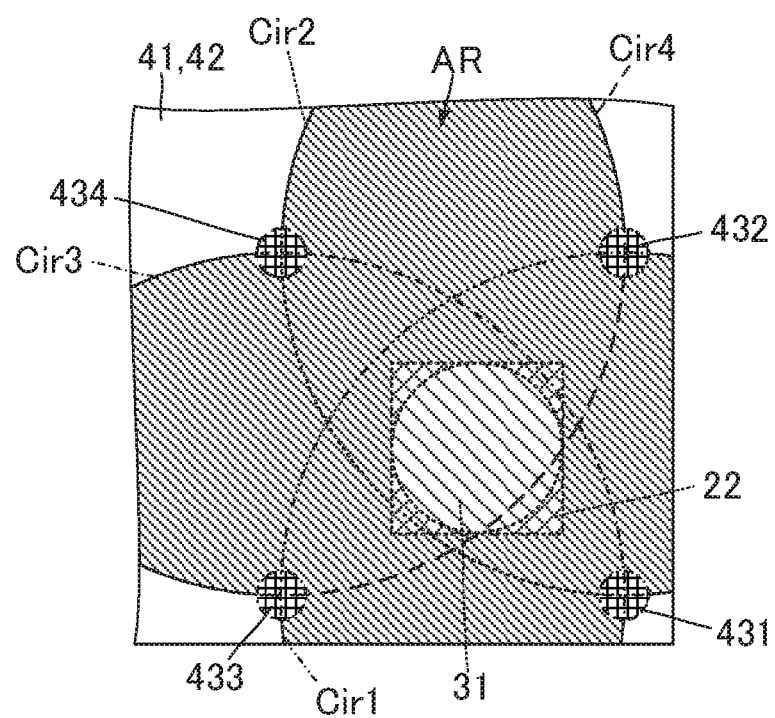
FIG. 3 is an enlarged plan view illustrating the positional relationships between a bump (a mounting land conductor) and each of the interlayer connection conductors in the resin substrate of the component mounted resin substrate according to the first preferred embodiment of the present invention.

In the resin substrate 20 according to the present preferred embodiment, positional relationships between the interlayer connection conductors 43 and the bumps 31 of the electronic component 30 preferably satisfy the condition described below. FIG. 3 is an enlarged plan view illustrating the positional relationships between the interlayer connection conductors and each of the bumps (or the mounting land conductors) in the resin substrate of the component mounted resin substrate according to the first preferred embodiment of the present invention.

As illustrated in FIG. 3, interlayer connection conductors 431, 432, 433 and 434 defining the plurality of interlayer connection conductors 43 are arranged discretely when viewing the resin base body 21 in plan view. Circles having centers in positions of the interlayer connection conductors 431, 432, 433 and 434 when viewed in plan view are shown in FIG. 3.

More specifically, a circle Cir1 having a center in a position of the interlayer connection conductor 431, a circle Cir2 having a center in a position of the interlayer connection conductor 432, a circle Cir3 having a center in a position of the interlayer connection conductor 433, and a circle Cir4 having a center in a position of the interlayer connection conductor 434 are set. The radius of each circle is defined by a distance between one interlayer connection conductor positioned at the center and another interlayer connection conductor closest to the one interlayer connection conductor. FIG. 3 represents the case in which two interlayer connection conductors are closest to one interlayer connection conductor through the same or substantially the same distance. In that case, any one of the closest interlayer connection conductors may be selected.

The mounting land conductor 22 is arranged in a region identical or substantially identical to any one of a region in which the circle Cir1 and the circle Cir2 overlap each other, a region in which the circle Cir1 and the circle Cir3 overlap each other, a region in which the circle Cir2 and the circle Cir4 overlap each other, and a region in which the circle Cir3 and the circle Cir4 overlap each other. Under this condition, the position corresponding to the bump 31 does not overlap the interlayer connection conductors 431, 432, 433 and 434.

By arranging the bumps 31 of the electronic component 30 and the interlayer connection conductors 43 in the above-described positional relationships, the strength of the resin base body 21 at the positions at which the mounting land conductors 22 are provided is effectively increased. As a result, higher joining strength is achieved with higher stability.

Figure 4:
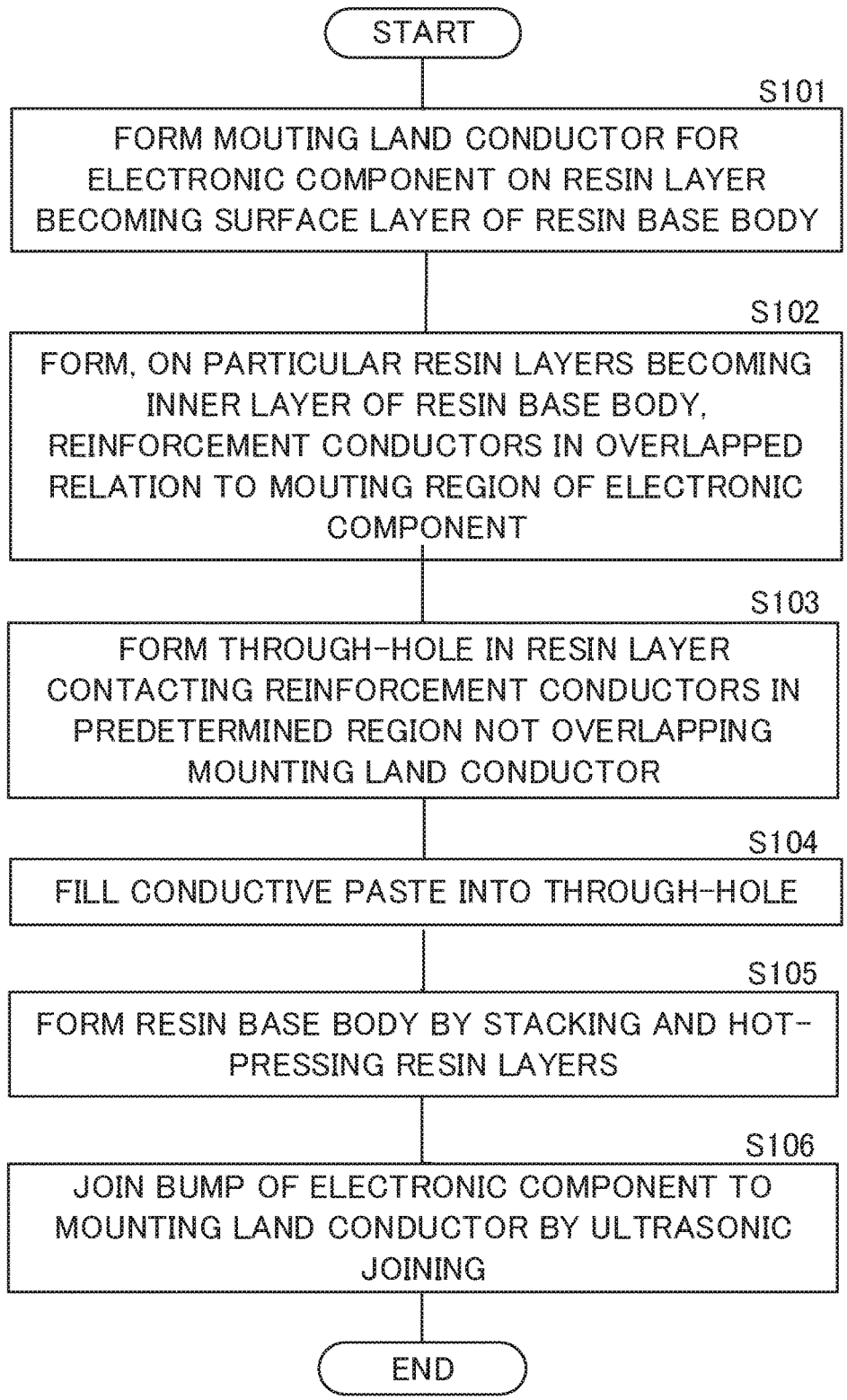
FIG. 4 is a flowchart illustrating the steps of manufacturing the component mounted resin substrate according to the first preferred embodiment of the present invention.

The component mounted resin substrate 10 structured as described above is manufactured through steps illustrated in FIG. 4. FIG. 4 is a flowchart illustrating the steps of manufacturing the component mounted resin substrate according to the first preferred embodiment of the present invention. FIG. 5 is a side sectional view illustrating a stacked state of the resin substrate of the component mounted resin substrate according to the first preferred embodiment of the present invention.

First, a plurality of thermoplastic resin layers 211 to 217 is prepared. As illustrated in FIG. 5, the mounting land conductors 22 to which the bumps 31 of the electronic component 30 are to be joined are formed on the resin layer 211 that becomes a front surface layer of the resin base body (S101). As illustrated in FIG. 5, the planar reinforcement conductor pattern 41 is formed on the resin layer 212 that is the second layer counting from the front surface layer of the resin base body, and the planar reinforcement conductor pattern 42 is formed on the resin layer 213 that is the third layer (S102). While the reinforcement conductor pattern 41 and the reinforcement conductor pattern 42 preferably entirely overlap each other in the present preferred embodiment, both of the patterns may partially overlap each other. In the above steps S101 and S102, the wiring conductor patterns 23 and the outer connection conductors 24 are also formed on the desired resin layers.

Through-holes are formed in the resin layer 212, which includes the reinforcement conductor pattern 41 formed thereon, in region overlapping the reinforcement conductor pattern 41, but not overlapping the mounting land conductors 22 when viewed in plan view in a state of the resin base body (S103). A conductive paste is filled into the through-holes (S104).

The resin base body 21 is formed by stacking the resin layers 211 to 217 and hot-pressing the stacked resin layers (S105). With heat provided during the hot-pressing, the conductive paste is solidified and the interlayer connection conductors 43 are formed.

The bumps 31 of the electronic component 30 are joined to the mounting land conductors 22 of the resin base body 21 by ultrasonic joining (S106).

The component mounted resin substrate 10 having high joining reliability is easily and reliably manufactured by the above-described manufacturing method.

Figure 6:
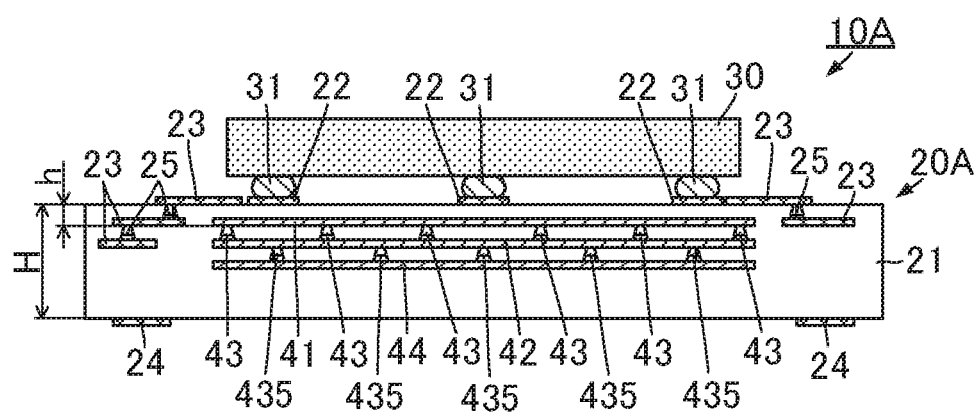
FIG. 6 is a sectional view illustrating a structure of a component mounted resin substrate according to a second preferred embodiment of the present invention.

A resin substrate 20A and a component mounted resin substrate 10A according to a second preferred embodiment of the present invention will be described below with reference to the drawings. FIG. 6 is a sectional view illustrating a structure of the component mounted resin substrate according to the second preferred embodiment of the present invention.

The component mounted resin substrate 10A according to the second preferred embodiment is different from the component mounted resin substrate 10 according to the first preferred embodiment in the structure of the resin substrate 20A. The resin substrate 20A further includes a reinforcement conductor pattern 44, in addition to the resin substrate 20 according to the first preferred embodiment. The reinforcement conductor pattern 44 corresponds to a "third reinforcement conductor pattern".

The reinforcement conductor pattern 44 is embedded in the resin base body 21. The reinforcement conductor pattern 44 is a planar conductor pattern similar to the reinforcement conductor patterns 41 and 42. The reinforcement conductor pattern 44 is closer to a side of the rear surface of the resin base body 21 than the reinforcement conductor pattern 42 in the thickness direction of the resin base body 21. When viewing the resin base body 21 in plan view, the reinforcement conductor pattern 44 overlaps the reinforcement conductor pattern 42. The reinforcement conductor pattern 44 is a dummy conductor similar to the reinforcement conductor patterns 41 and 42.

The reinforcement conductor pattern 44 is connected to the reinforcement conductor pattern 42 by a plurality of interlayer connection conductors 435. The interlayer connection conductors 435 are not connected to any conductor patterns other than the reinforcement conductor patterns 42 and 44, and they are also dummy conductors that do not function as an electrical circuit. Thus, the reinforcement conductor pattern 44 and the interlayer connection conductors 435 are not connected to any other conductor patterns provided in contact with the resin base body 21 similar to the reinforcement conductor patterns 41 and 42 and the interlayer connection conductors 43. The interlayer connection conductors 435 connecting between the reinforcement conductor pattern 44 and the reinforcement conductor pattern 42 correspond to "second interlayer connection conductors".

When viewing the resin base body 21 in plan view, the interlayer connection conductors 435 are arranged at positions different from positions of the interlayer connection conductors 43. In other words, the interlayer connection conductors 435 are arranged at positions not overlapping the interlayer connection conductors 43. When viewing the resin base body in plan view, the interlayer connection conductors 435 are preferably disposed at positions different from positions of the bumps 31 (at positions not overlapping the bumps 31) of the electronic component 30, but they may be disposed at positions overlapping the bumps 31. The reason is that influences on the joining are relatively small because the interlayer connection conductors 435 are disposed at positions farther away from the bumps 31 than the interlayer connection conductors 43 in the thickness direction of the resin base body 21.

With the above-described arrangement, the strength of the three-dimensional structure is further increased. Accordingly, the joining defect caused by softening of the resin base body 21 is more reliably reduced or prevented.

While the present preferred embodiment represents the case in which the reinforcement conductor patterns are provided with three layers and every pair of adjacent layers are connected by the interlayer connection conductors, the reinforcement conductor patterns may be provided with four or more layers and every adjacent layers may be connected by the interlayer connection conductors.

Figure 7A:
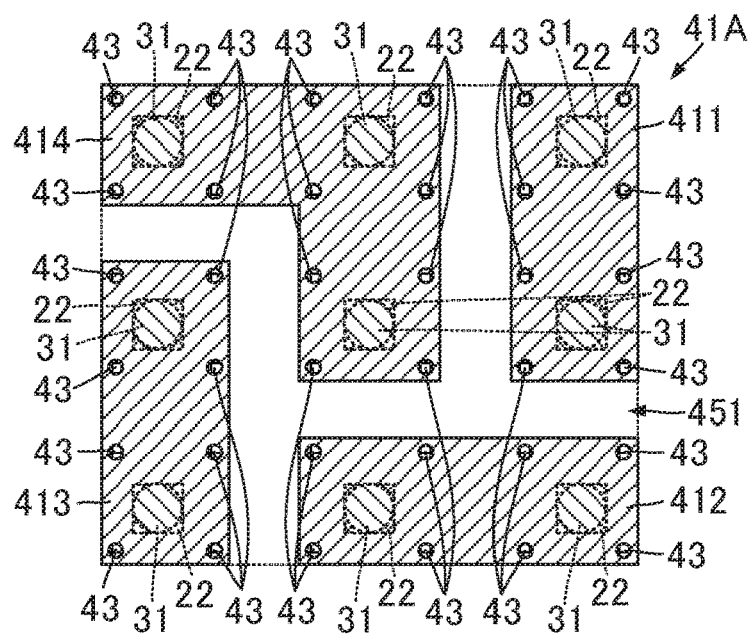
FIG. 7A is a plan view of a first reinforcement conductor pattern according to a third preferred embodiment of the present invention.
Figure 7B:
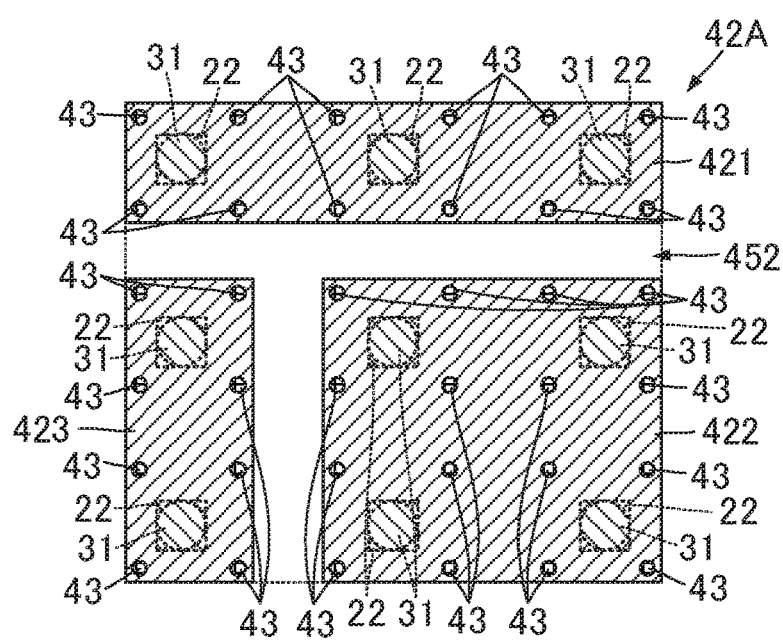
FIG. 7B is a plan view of a second reinforcement conductor pattern according to the third preferred embodiment of the present invention.

A component mounted resin substrate according to a third preferred embodiment of the present invention will be described below with reference to the drawings. FIGS. 7A and 7B are plan views illustrating layouts of reinforcement conductor patterns in the component mounted resin substrate according to the third preferred embodiment. FIG. 7A is a plan view of a first reinforcement conductor pattern 41A, and FIG. 7B is a plan view of a second reinforcement conductor pattern 42A.

The component mounted resin substrate according to the third preferred embodiment is different from the component mounted resin substrate according to the first preferred embodiment in that the reinforcement conductor pattern is divided into a plurality of individual conductor patterns.

The reinforcement conductor pattern 41A corresponding to the reinforcement conductor pattern 41 according to the first preferred embodiment is divided into individual conductor patterns 411, 412, 413 and 414. With such division, the reinforcement conductor pattern 41A includes a conductor non-formed portion 451 having a band shape opening to an outer periphery (dotted line in FIG. 7A) of the reinforcement conductor pattern 41A.

When viewing the resin base body 21 in plan view, the conductor non-formed portion 451 is provided at a position different from the positions of the mounting land conductors 22. Thus, the conductor non-formed portion 451 is also provided at a position different from the positions of the bumps 31 of the electronic component 30. Furthermore, the conductor non-formed portion 451 is not provided between the bump 31 (i.e., the mounting land conductor 22) and the interlayer connection conductor 43 that are disposed closest each other. In other words, the conductor non-formed portion 451 is provided between the interlayer connection conductors 43. As a result, any conductor non-formed portion (i.e., a portion in which a conductor is absent) is not provided between the positions of the bumps 31 and the positions of the interlayer connection conductors 43 closest to the bumps 31 when viewed in plan view, and a reduction of the reinforcement effect of the reinforcement conductor pattern 41A caused by including the conductor non-formed portion 451 is reduced or prevented.

The reinforcement conductor pattern 42A corresponding to the reinforcement conductor pattern 42 according to the first preferred embodiment is divided into individual conductor patterns 421, 422 and 423. With such division, the reinforcement conductor pattern 42A includes a conductor non-formed portion 452 having a band shape opening to an outer periphery (dotted line in FIG. 7B) of the reinforcement conductor pattern 42A.

When viewing the resin base body 21 in plan view, the conductor non-formed portion 452 is provided at a position different from the positions of the mounting land conductors 22. Thus, the conductor non-formed portion 452 is also provided at a position different from the positions of the bumps 31 of the electronic component 30. Furthermore, the conductor non-formed portion 452 is not provided between the bump 31 (i.e., the mounting land conductor 22) and the interlayer connection conductor 43 that are provided closest each other. In other words, the conductor non-formed portion 452 is provided between the interlayer connection conductors 43. As a result, any conductor non-formed portion (i.e., a portion in which a conductor is absent) is not provided between the positions of the bumps 31 and the positions of the interlayer connection conductors 43 closest to the bumps 31 when viewed in plan view, and a reduction of the reinforcement effect of the reinforcement conductor pattern 42A caused by including the conductor non-formed portion 452 is reduced or prevented.

With the foregoing arrangement, in addition to providing the above-mentioned effect of reducing or preventing the joining defect, wiring conductors are able to be provided in the conductor non-formed portions 451 and 452, such that a degree of freedom in laying out the wiring conductors in the resin base body 21 is increased and the laying-out of the wiring conductors is facilitated. In particular, in the case in which the reinforcement conductor patterns 41A and 42A are provided near the front surface of the resin base body 21 as described above, it is difficult to provide regions for wirings connected to the mounting land conductors 22. However, the configuration according to the present preferred embodiment is effective in providing such regions for wirings.

Preferably, the conductor non-formed portion 451 of the reinforcement conductor pattern 41A and the conductor non-formed portion 452 of the reinforcement conductor pattern 42 are not overlapped with each other. Alternatively, the conductor non-formed portion may be omitted in the reinforcement conductor pattern 42.

While the above preferred embodiments of the present invention describe examples in which the reinforcement conductor patterns and the interlayer connection conductors connecting those reinforcement conductor patterns are preferably provided as dummy conductors, they may be utilized as a portion of circuit patterns. However, it is advantageous to provide the reinforcement conductor patterns and the interlayer connection conductors connecting those reinforcement conductor patterns as dummy conductors with intent only to ensure the reinforcement at the time of mounting the component, and there is no need to consider for connection to other conductor patterns for a circuit. In addition, the shapes of those members are easily simplified because only the reinforcement needs to be considered without electrical characteristics being considered.

While the above preferred embodiments of the present invention describe examples of using a conductor for the reinforcement, a material for the reinforcement is not limited to the conductor, and the material is only required to have greater strength than the resin of the resin base body at the temperature at least under a situation in which heat generated by the ultrasonic joining is applied. As such, the interlayer connection conductor is also not always required to be a conductor, and may be a columnar member having the same height as the resin layer, for example.

Figure 8A:
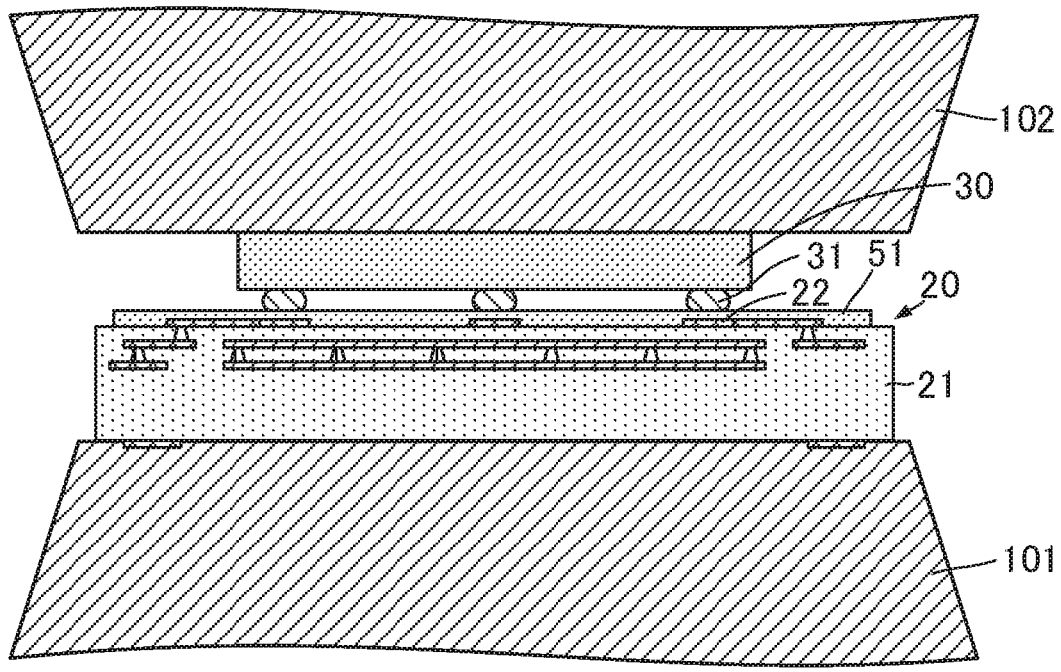
FIG. 8A is a side sectional view of a component mounted resin substrate, in a state during manufacturing, according to a fourth preferred embodiment of the present invention.
Figure 8B:
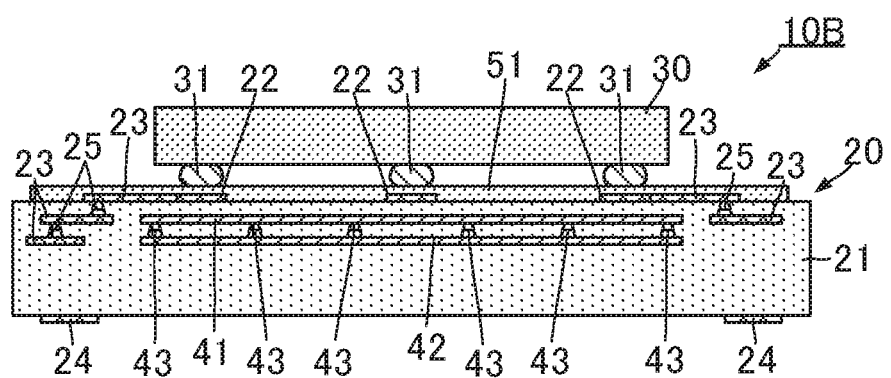
FIG. 8B is a side sectional view of the component mounted resin substrate according to the fourth preferred embodiment of the present invention.

A component mounted resin substrate according to a fourth preferred embodiment of the present invention will be described below with reference to the drawings. FIG. 8A is a side sectional view of the component mounted resin substrate, in a state during manufacturing, according to the fourth preferred embodiment of the present invention, and FIG. 8B is a side sectional view of the component mounted resin substrate according to the fourth preferred embodiment of the present invention.

In a method of manufacturing the component mounted resin substrate according to the present preferred embodiment, the steps illustrated in FIG. 4 are modified such that the bumps of the electronic component are joined to the mounting land conductors using an anisotropic conductive film (AFC) 51, which is interposed between the bumps and the mounting land conductors, instead of the ultrasonic joining in the step S106. Detailed procedures in the step S106 in the present preferred embodiment are as follows.

First, as illustrated in FIG. 8A, a portion of the surface (mounting surface) of the resin base body 21, the portion covering the mounting land conductors 22 and the wiring conductor patterns 23, is covered with an anisotropic conductive film 51. The configuration of the resin base body 21 excluding the anisotropic conductive film 51 is the same or substantially the same as that described in the first preferred embodiment.

Then, the electronic component 30 is disposed (stacked) on the resin base body 21. The configuration of the electronic component 30 is the same or substantially the same as that described in the first preferred embodiment.

Thereafter, as illustrated in FIG. 8A, the resin base body 21 and the electronic component 30 stacked one on top of the other are disposed between jigs 101 and 102 for hot-pressing, and hot-pressing is performed on the resin base body 21 and the electronic component 30 at a predetermined temperature and a predetermined pressure by using the jigs 101 and 102.

The component mounted resin substrate 10B illustrated in FIG. 8B is obtained through the above-described steps.

The anisotropic conductive film (ACF) is preferably a film formed by molding a material obtained by dispersing fine metal particles in a thermosetting resin into a film shape. With the hot-pressing, plating layers of the particles in the anisotropic conductive film, which is located between the mounting land conductors 22 and the bumps 31, are brought into contact with each other, so that conductive paths are formed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin substrate comprising:
   a thermoplastic resin base body;
   a mounting land conductor provided on a surface of the resin base body to be connected to a component;
   a first reinforcement conductor pattern embedded in the resin base body, and having a planar shape overlapping an entirety or substantially an entirety of the mounting land conductor when viewing the resin base body in plan view;
   a second reinforcement conductor pattern embedded in the resin base body, and having a planar shape of which at least a portion overlaps the first reinforcement conductor pattern, and which includes a position overlapping the mounting land conductor, when viewing the resin base body in plan view;
   a plurality of first interlayer connection conductors connecting the first reinforcement conductor pattern and the second reinforcement conductor pattern in a thickness direction of the resin base body;
   a third reinforcement conductor pattern embedded in the resin base body, and having a planar shape of which at least a portion overlaps the first reinforcement conductor pattern and the second reinforcement conductor pattern, and which includes a position overlapping the mounting land conductor, when viewing the resin base body in plan view; and a plurality of second interlayer connection conductors connecting the second reinforcement conductor pattern and the third reinforcement conductor pattern in the thickness direction of the resin base body; wherein the plurality of first interlayer connection conductors are located at positions different from the mounting land conductor when viewing the resin base body in plan view; and the plurality of first interlayer connection conductors and the plurality of second interlayer connection conductors are located at different positions when viewing the resin base body in plan view.

2. The resin substrate according to claim 1, wherein the first reinforcement conductor pattern, the second reinforcement conductor pattern, the plurality of first interlayer connection conductors, the third reinforcement conductor pattern, and the plurality of second interlayer connection conductors are not connected to other conductor patterns in contact with the resin base body.

3. The resin substrate according to claim 1, wherein
the mounting land conductor includes a plurality of mounting land conductors; and
the first reinforcement conductor pattern overlaps the plurality of mounting land conductors when viewing the resin base body in plan view.

4. The resin substrate according to claim 3, wherein the first reinforcement conductor pattern includes, at a position different from positions of the plurality of mounting land conductors, a conductor non-formed portion in which the first reinforcement conductor pattern is not provided, when viewing the resin base body in plan view.

5. The resin substrate according to claim 1, wherein a distance between the first reinforcement conductor pattern and the surface of the resin base body is smaller than half a thickness of the resin base body.

6. The resin substrate according to claim 5, wherein
the resin base body includes a plurality of thermoplastic resin layers that are stacked; and
the first reinforcement conductor pattern is located between a first resin layer of the plurality of thermoplastic resin layers at the surface of the resin base body at which the mounting land conductor is provided and a second resin layer of the plurality of thermoplastic resin layers contacting the first resin layer.

7. A component mounted resin substrate comprising:
the resin substrate according to of claim 1; and
the component connected to the mounting land conductor.

8. A component mounted resin substrate comprising:
a resin substrate including:
a thermoplastic resin base body;
a mounting land conductor provided on a surface of the resin base body and connected to the component;
a first reinforcement conductor pattern embedded in the resin base body, and having a planar shape including a position overlapping the mounting land conductor when viewing the resin base body in plan view;
a second reinforcement conductor pattern embedded in the resin base body, and having a planar shape of which at least a portion overlaps the first reinforcement conductor pattern, and which includes a position overlapping the mounting land conductor, when viewing the resin base body in plan view; and
a plurality of first interlayer connection conductors connecting the first reinforcement conductor pattern and the second reinforcement conductor pattern in a thickness direction of the resin base body;

a component joined to the resin substrate with a plurality of bumps interposed therebetween;

a third reinforcement conductor pattern embedded in the resin base body, and having a planar shape of which at least a portion overlaps the first reinforcement conductor pattern and the second reinforcement conductor pattern, and which includes a position overlapping the mounting land conductor, when viewing the resin base body in plan view; and a plurality of second interlayer connection conductors connecting the second reinforcement conductor pattern and the third reinforcement conductor pattern in the thickness direction of the resin base body; wherein the component is mounted to the resin base body with the plurality of bumps ultrasonically joined to the mounting land conductor;

the plurality of first interlayer connection conductors are located at positions different from the plurality of bumps when viewing the resin base body in plan view;

the plurality of bumps entirely or substantially entirely overlap the first reinforcement conductor pattern when viewing the resin base body in plan view; and the plurality of first interlayer connection conductors and the plurality of second interlayer connection conductors are located at different positions when viewing the resin base body in plan view.

9. The component mounted resin substrate according to claim 8, wherein the first reinforcement conductor pattern, the second reinforcement conductor pattern, the plurality of first interlayer connection conductors, the third reinforcement conductor pattern, and the plurality of second interlayer connection conductors are not connected to other conductor patterns in contact with the resin base body.

10. The component mounted resin substrate according to claim 8, wherein
the mounting land conductor includes a plurality of mounting land conductors; and
the first reinforcement conductor pattern overlaps the plurality of mounting land conductors when viewing the resin base body in plan view.

11. The component mounted resin substrate according to claim 10, wherein the first reinforcement conductor pattern includes, at a position different from positions of the plurality of mounting land conductors, a conductor non-formed portion in which the first reinforcement conductor pattern is not provided, when viewing the resin base body in plan view.

12. The component mounted resin substrate according to claim 8, wherein a distance between the first reinforcement conductor pattern and the surface of the resin base body is smaller than half a thickness of the resin base body.

13. The component mounted resin substrate according to claim 12, wherein
the resin base body includes a plurality of thermoplastic resin layers that are stacked; and
the first reinforcement conductor pattern is located between a first resin layer of the plurality of thermoplastic resin layers at the surface of the resin base body at which the mounting land conductor is provided and a second resin layer of the plurality of thermoplastic resin layers contacting the first resin layer.

14. The component mounted resin substrate according to claim 8, wherein, assuming that, when viewing the resin base body in plan view, a circular region is set for each of the plurality of first interlayer connection conductors, the circular region having a center in a position of one of the plurality of first interlayer connection conductors and a radius defined by a distance between the one of the plurality of first interlayer connection conductors and another of the plurality of first interlayer connection conductors closest the one of the plurality of first interlayer connection conductors, at least one of the plurality of bumps overlaps a region in which circular regions overlap each other.

* * * * *